(12) United States Patent
Merritt

(10) Patent No.: US 6,363,032 B2
(45) Date of Patent: Mar. 26, 2002

(54) PROGRAMMABLE COUNTER CIRCUIT FOR GENERATING A SEQUENTIAL/INTERLEAVE ADDRESS SEQUENCE

(75) Inventor: Todd A. Merritt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/773,676

(22) Filed: Feb. 2, 2001

Related U.S. Application Data

(63) Continuation-in-part of application No. 09/609,935, filed on Jun. 30, 2000, now Pat. No. 6,215,729.

(51) Int. Cl.$^7$ ................................................ G11C 8/00
(52) U.S. Cl. ..................... 365/236; 365/238.5; 365/239
(58) Field of Search ................................ 365/236, 239, 365/238.5, 230.02

(56) References Cited

U.S. PATENT DOCUMENTS

| | | | |
|---|---|---|---|
| 5,392,239 A | 2/1995 | Margulis et al. | 365/189.01 |
| 5,481,581 A | 1/1996 | Jones, Jr. | 377/55 |
| 5,805,523 A | 9/1998 | Lysinger | 365/230.08 |
| 5,831,926 A | 11/1998 | Norris et al. | 365/230.04 |
| 5,835,970 A | 11/1998 | Landry et al. | 711/218 |
| 5,966,420 A | 10/1999 | Lee | 377/33 |
| 6,011,751 A | * 1/2000 | Hirabayashi | 365/236 |
| 6,078,636 A | 6/2000 | Shirai et al. | 365/236 |
| 6,091,665 A | * 7/2000 | Dorney | 365/236 |
| 6,130,853 A | 10/2000 | Wang et al. | 365/236 |

* cited by examiner

Primary Examiner—Tan T. Nguyen
(74) Attorney, Agent, or Firm—Dickstein Shapiro Morin & Oshinsky LLP

(57) ABSTRACT

A programmable counter circuit for use in semiconductor memories for generating both sequential and interleave address sequences for block data accesses is disclosed. The output and complementary output of the counter for a previous bit are multiplexed to send the proper carry bit information to the counter for the next bit. In interleave mode, the carry bit forces the row/column counter to count in an interleave address sequence. In sequential mode, the start address of the memory access is captured and held. Either the output or complementary output of the counter for a previous bit is used to control the counter of the next bit based on the captured start address bit. The counter can be programmed to automatically increment the memory address in both a binary and interleave sequence in order to increase the access speed for blocks of sequential data in semiconductor memories.

65 Claims, 4 Drawing Sheets

PROGRAMMABLE COUNTER CIRCUIT FOR GENERATING A SEQUENTIAL/INTERLEAVE ADDRESS SEQUENCE

This application is a Continuation-In-Part application of U.S. patent application Ser. No. 09/609,935 filed Jun. 30, 2000 now U.S. Pat. No. 6,215,729, the entirety of which is incorporated herein by reference.

BACKGROUND OF THE INVENTION

1. Field of the Invention

The present invention relates generally to memory devices, and more particularly to a programmable counter circuit for use in memory devices for generating a sequential/interleave address sequence.

2. Description of the Related Art

Computer memory systems utilize various techniques for enhancing performance of the memory system. One such technique is "burst mode" memory access. A typical burst mode access begins when a memory controller applies an initial address within a burst address space to a memory chip in the memory system, and instructs the memory chip to load the address. After a specific, predetermined amount of time (usually 1 or 2 clock cycles), the memory chip responds with the data stored at the initial address. At the next clock cycle, the memory chip outputs data from a next address within the burst address space of the initial address.

Typically, the addresses within the burst address space are accessed sequentially. For example, if the initial address applied to the memory chip is address 0, on the next clock cycle the data from address 0 is available from the memory chip. Then, on the next single clock cycle, the memory chip delivers data from address 1, and on the next single clock cycle, the memory chip delivers data from address 2, and so on. Such incrementing is done by implementing the addresses in a sequence, using a counter to supply the increments. Binary sequential mode refers to counting in a traditional sequence with the numbers represented in a binary format. In a linear mode, the burst counter always counts up. In a non-linear mode, the burst counter either counts up or down, depending on the start address. Improved memory system performance is achieved since data is available on every clock cycle, after the initial address is presented to the memory chips.

FIG. 1 illustrates how a counter circuit is incorporated into a memory device for generating sequential (binary) and interleaved addresses. Circuit 20 includes a memory cell array 22 that receives inputs from row decoders 24, column decoders 26, and input buffers 28. Array 24, cooperating with sense amplifiers (not shown) generates outputs to output buffers 30. Input buffers 28 and output buffers 50 are used for data that is to be retrieved from or stored in the array 22. Decoders 24 and 26 are used to select a unique row and column. Each combination of row and column will address a unique memory cell within the array. Address decoders 24 and 26 receive address lines from the address latch 32. The address latch 32 can be directly loaded from the input buffers 28 or from a counter 34. Counter 34 receives a starting count value from input buffers 28. As a result, a counter circuit such as counter 34 can be used to generate addresses for a memory circuit.

Table 1 below provides a chart for a three bit sequential count sequence for both binary and interleave modes, where $a_{in}$ is the least most significant bit of the start address, $a_{in}2$ is the next most significant bit after $a_{in}$, and $a_{in}3$ is the next most significant bit after $a_{in}2$.

TABLE 1

BINARY/INTERLEAVE ADDRESSING SEQUENCE

| Start Address ($a_{in}3, a_{in}2, a_{in}$) | Sequential (Binary) addressing | Interleave addressing |
|---|---|---|
| 000 | 0,1,2,3,4,5,6,7 | 0,1,2,3,4,5,6,7 |
| 001 | 1,2,3,4,5,6,7,0 | 1,0,3,2,5,4,7,6 |
| 010 | 2,3,4,5,6,7,0,1 | 2,3,0,1,6,7,4,5 |
| 011 | 3,4,5,6,7,0,1,2 | 3,2,1,0,7,6,5,4 |
| 100 | 4,5,6,7,0,1,2,3 | 4,5,6,7,0,1,2,3 |
| 101 | 5,6,7,0,1,2,3,4 | 5,4,7,6,1,0,3,2 |
| 110 | 6,7,0,1,2,3,4,5 | 6,7,4,5,2,3,0,1 |
| 111 | 7,0,1,2,3,4,5,6 | 7,6,5,4,3,2,1,0 |

While the binary mode counting progresses in a traditional counting sequence, interleave mode counting may vary significantly, depending on the starting count value. In interleave mode, the first bit (the least most significant bit) will toggle every count increment. The second bit will toggle on every second count increment, i.e., on the second, fourth, sixth, eighth, etc. count increments. The third bit will toggle on very fourth count increment, i.e., on the fourth, eighth, twelfth, etc., count increments.

As processor speeds continue to increase, increased memory access speeds are becoming more important. As such, it is desirous to provide counter circuits for memory devices that can automatically increment the memory address in both a binary and interleave sequence in order to increase the access speed for blocks of sequential data in semiconductor memories.

SUMMARY OF THE INVENTION

The present invention provides a programmable counter circuit for use in semiconductor memories for generating both sequential and interleave address sequences for block data accesses.

In accordance with the present invention, the output and complementary output of the counter for the previous bit are multiplexed to send the proper carry bit information to the toggle input of the counter for the next bit. In interleave mode, the carry bit forces the row/column counter of the memory device to count in an interleave address sequence. In sequential mode, the start address of the memory access is captured and held. Either the output or complementary output of the counter for the previous bit is used to control the counter of the next bit based on the captured start address bit. Operation is similar in row access mode, such that the rows are accessed in a sequential manner. The counter circuits for memory devices according to the present invention can be programmed to automatically increment the memory address in both a binary and interleave sequence in order to increase the access speed for blocks of sequential data in semiconductor memories.

These and other advantages and features of the invention will become more readily apparent from the following detailed description of the invention which is provided in connection with the accompanying drawings.

DETAILED DESCRIPTION OF THE PREFERRED EMBODIMENTS

Figure 1:
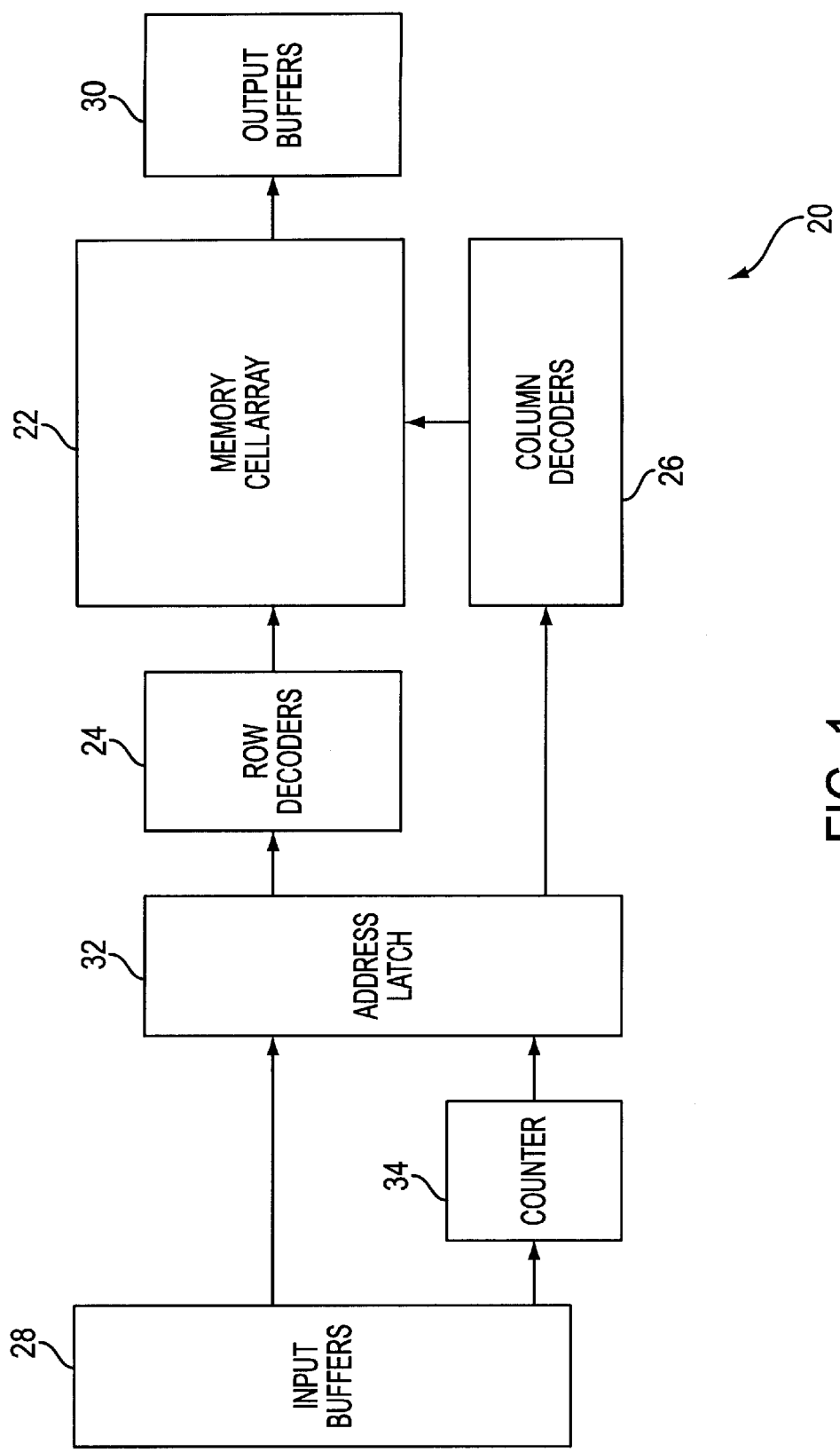
FIG. 1 illustrates in block diagram form a memory circuit incorporating a conventional counter for address generation.

The present invention will be described as set forth in the preferred embodiments illustrated in FIGS. 2–4. Other embodiments may be utilized and structural or logical changes may be made without departing from the spirit or scope of the present invention. Like items are referred to by like reference numerals.

In accordance with the present invention, the output and complementary output of a burst counter circuit are multiplexed to send the proper carry bit information to the row/column counter of a memory device. In interleave mode, the carry bit is forced to match that of the burst counter. In sequential mode, the start address of the memory access is captured and held. Either the output or complementary output of the burst counter is used to control the column counter based on the captured start address bit.

Figure 2:
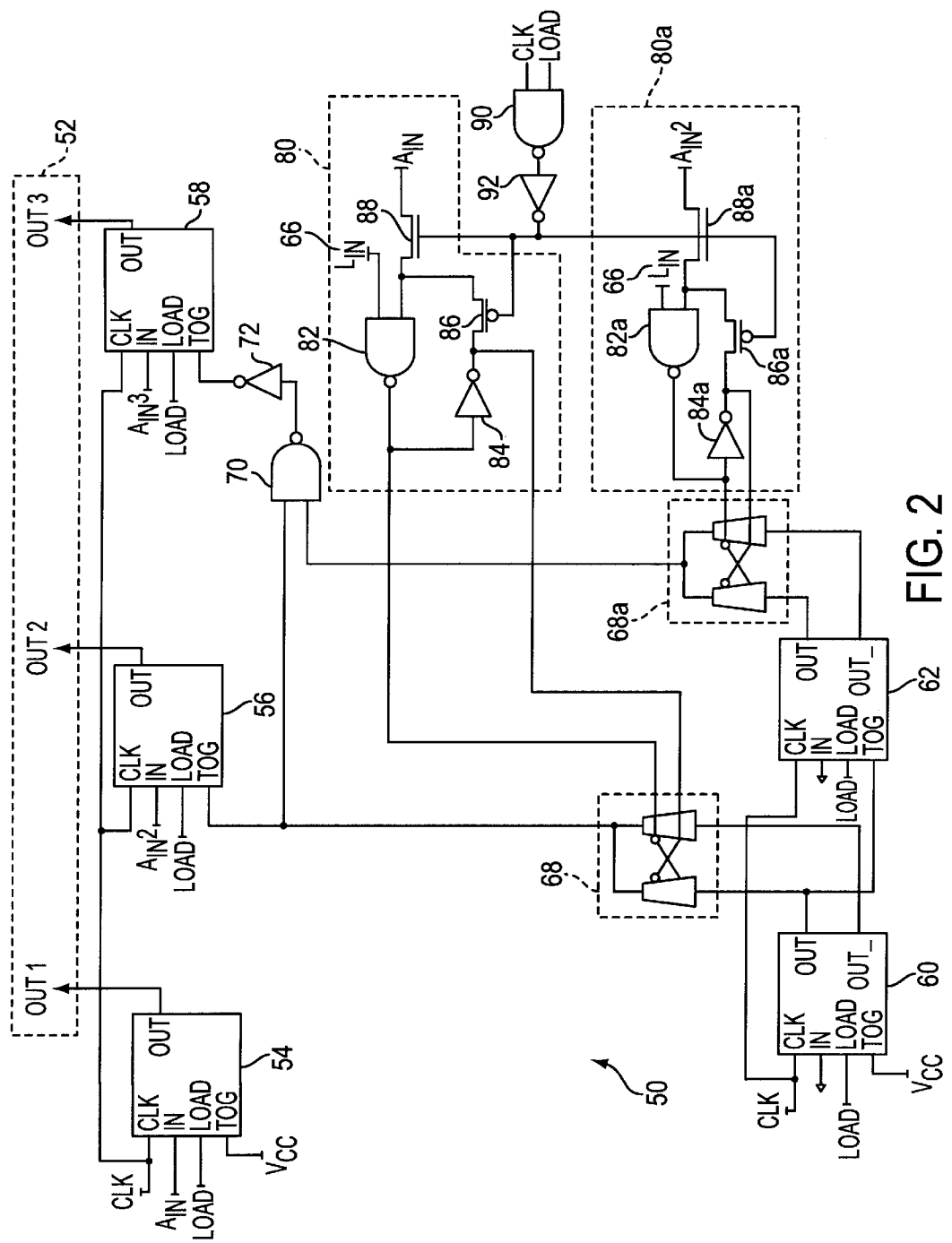
FIG. 2 illustrates in schematic diagram form a counter circuit in accordance with one embodiment of the present invention.

FIG. 2 illustrates in schematic diagram form a counter circuit 50 in accordance with the present invention. Counter circuit 50 could be used in place of counter 34 of FIG. 1 to provide improved address generation. Circuit 50 is preferably part of an integrated circuit, preferably a semiconductor memory device. The output 52 of circuit 50 is the count signal provided to address latch 32.

Circuit 50 includes five flip-flops 54, 56, 58, 60 and 62. Flip-flops 54, 56 and 58 function as a counter and store the current count value. Flip-flops 60 and 62 function as a bust counter to generate the sequential or interleave carry bit. The address sequence, i.e., sequential or interleave, is based on a control signal (lin) input 66 to the circuit 50 as further described below. The outputs from the burst counter, i.e., flip-flops 60, 62 are input to the counter, i.e., flip-flops 56 and 58. Each flip-flop 54, 56, 58, 60 and 62 is provided with four inputs, a clock input (clk), an address input (in), a load input (load) and a toggle input (tog). The clock (clk) input of each flip-flop 54, 56, 58, 60 and 62 is connected to receive a system clock signal. The load input (load) of each flip-flop 54, 56, 58, 60 and 62 is connected to receive a load signal (described below). The address input (in) of flip-flop 54 is connected to receive a signal $a_{in}$, which is the least most significant bit of the access starting address of the memory device. The address input (in) of flip-flop 56 is connected to receive a signal $a_{in}2$, which is the next most significant bit of the access starting address after $a_{in}$, and the address input (in) of flip-flop 58 is connected to receive a signal $a_{in}3$, which is the next most significant bit of the access starting address after $a_{in}2$. The address inputs (in) of flip-flops 60 and 62 are connected to ground to receive a low input, i.e., a logic 0.

The output (OUT) of flip-flops 54, 56 and 58 are provided to the output 52 of circuit 50, which as noted above is the count signal provided to address latch 32. The output (OUT) and complementary output (OUT_) of flip-flop 60 are input to a multiplexer 68 while the output (OUT) and complementary output (OUT_) of flip-flop 62 are input to a multiplexer 68a. The output from multiplexer 68 is input to the toggle (tog) input of flip-flop 56 and to a first input of a NAND gate 70. The output from multiplexer 68a is input to the second input of NAND gate 70. The output of NAND gate 70 is inverted by inverter 72 and input to the toggle (tog) input of flip-flop 58.

The operation of multiplexers 68 and 68a, i.e., whether the signal OUT or OUT_ of flip-flops 60 and 62 will be passed through each multiplexer 68 and 68a, is controlled by circuits 80 and 80a, respectively. Circuit 80 includes a NAND gate 82, having a first input connected to receive control signal lin 66. The state of control signal lin 66 determines whether a sequential or interleave burst mode carry bit will be generated. If lin 66 is a low signal, i.e., a logic 0, the circuit 50 will count in interleave mode. Conversely, if lin 66 is a high signal, i.e., a logic 1, the circuit 50 will count in sequential mode. The second input of NAND gate 82 is connected to the address signal $a_{in}$ through a transistor 88. The output of NAND gate 82 is connected to a first input of multiplexer 68 and to the input of an inverter 84. The output of inverter 84 is connected to a first terminal of a P-channel transistor 86 and also to a second input of multiplexer 68. The second terminal of transistor 86 is connected to the second input of NAND gate 82. The gate of transistor 86 is connected to the gate of transistor 88, which is connected to the output of an inverter 92. The input of inverter 92 is connected to the output of NAND gate 90, which has a first input connected to receive the clock (clk) signal and a second input connected to receive the load (load) signal. The load signal goes high synchronously with the clock signal (clk) when a new read or write command is being performed, i.e., when a new starting address is being input to the system. Thus, the load signal (load) will remain low unless an initial address is being input to the circuit.

Circuit 80a is similar to that of circuit 80, and includes NAND gate 82a, inverter 84a, P-channel transistor 86a and transistor 88a. The input to the first terminal of transistor 88a is the address signal $a_{in}2$.

The operation of the circuit 50 will now be described. When a new read or write burst command is requested, the signal load (load) will go high synchronously with the clock signal (clk) going high. When the load signal goes high, each of the flip-flops 54, 56, 58 60 and 62 will be reset. The high inputs from the clock signal (clk) and load signal (load) will cause the output of NAND gate 90 to go low, thereby causing the output of inverter 92 to go high. The high output at inverter 92 will turn on transistors 88 and 88a, allowing the signals $a_{in}$ and $a_{in}2$ to be input to the NAND gates 82 and 82a respectively. The three least most significant bits of the starting address, i.e., $a_{in}$, $a_{in}2$ and $a_{in}3$ will be input to the address inputs (in) of the flips-flops 54, 56 and 58, respectively to initialize each of the flip-flops.

The toggle input (tog) of flip-flop 54, which produces the least most significant bit of the output count 52, is connected to a voltage potential, typically Vcc, and therefore the output of flip-flop 54 will toggle with every clock cycle. Similarly, the toggle input (tog) of flip-flop 60 is also connected to a voltage potential, typically Vcc, and therefore the outputs OUT and OUT_ of flip-flop 60 will toggle with every clock cycle.

Suppose for example an interleave burst access is desired. The signal lin 66 will be a low signal, i.e., a logic 0. The operation of circuit 80 will be as follows. The input of the low signal lin 66 to the first input of NAND gate 82 will produce a high signal at the output of NAND gate 82, regardless of the state of the signal $a_{in}$ that is input to the second input of NAND gate 82. The high signal output from NAND gate 82 is input to the first terminal of the multiplexer 68 and the input of the inverter 84. The output of inverter 84 will be low, which is input to the second terminal of multiplexer 68. The combination of the high input at the first terminal of multiplexer 68 and the low signal at the second terminal of multiplexer 68 will cause multiplexer 68 to pass only the signal being input to the first input of the multiplexer 68, i.e., the output OUT from flip-flop 60.

Circuit 80a operates similarly to that of circuit 80. The input of the low signal lin 66 to the first input of NAND gate 82a will produce a high signal at the output of NAND gate 82a, regardless of the state of the signal $a_{in}2$ that is input to the second input of NAND gate 82a. The high signal output from NAND gate 82a is input to the first terminal of the multiplexer 68a and the input of the inverter 84a. The output of inverter 84a will be low, which is input to the second terminal of multiplexer 68a. The combination of the high input at the first terminal of multiplexer 68a and the low signal at the second terminal of multiplexer 68a will cause multiplexer 68a to pass only the signal being input to the first input of the multiplexer 68a, i.e., the output OUT from flip-flop 62.

The output from multiplexer 68 is input to the toggle input (tog) of flip-flop 56, and also input to a first input of NAND gate 70. The output from the multiplexer 68a is input to the second input of NAND gate 70. The output of NAND gate 70 is inverted by inverter 72, and input to the toggle input (tog) of flip-flop 58. In accordance with the present invention, the passing of only the signals on the OUT outputs of flip-flops 60 and 62, and not the passing of the outputs OUT_, will cause the counter, i.e., flip-flops 54, 56 and 58, to count in an interleave mode as follows.

For example, suppose the last three most significant bits, i.e., $a_{in}3$, $a_{in}2$, and $a_{in}$, of a starting address for a burst access are the binary number 111. As illustrated in Table 1, the interleave address sequence is 7,6,5,4,3,2,1,0. At time $t_0$, the binary signals $a_{in}$, $a_{in}2$ and $a_{in}3$ are input to the address inputs (in) of flip-flops 54, 56 and 58, respectively, and a ground signal is input to the address inputs (in) of flip-flops 60, 62. On the first clock cycle, the inputs to each respective flip-flop will be carried through to the output OUT. Thus, the first count signal will be output on output 52 as binary 111 (decimal seven), as a binary 1 is the signal input to the address signal (in) for each flip-flop 54, 56, 58, and the memory chip responds with the data stored at the initial address. Also on the first clock cycle, the output OUT of flip-flops 60 and 62 will be a low signal, as their address inputs (in) are tied to ground. The low outputs on output OUT of flip-flops 60 and 62 are passed through multiplexers 68, 68a, respectively, as described above, and input to NAND gate 70. The output of NAND gate 70 will be high, which when inverted by inverter 72 will be input as a low signal to the toggle input (tog) of flip-flop 58. Sequential data will be available on each subsequent clock cycle as follows.

On the second clock cycle, the output OUT of flip-flop 54 will transition from a high signal to a low signal and the output OUT of flip-flop 60 will transition from a low signal to a high signal, as their toggle inputs (tog) are tied to Vcc and will therefor toggle on every clock cycle. The outputs OUT of flip-flops 56 and 58, having the low inputs at their address input (in) from the output OUT of flip-flop 60 and the inverter 72 when the second clock cycle occurs, will not toggle, i.e., they will remain in the same state, which is a high signal. Thus, on the second clock cycle, the output count on output 52, from the most significant bit ($a_{in}3$) to the least significant bit ($a_{in}$) will be a binary 110 (decimal 6), i.e., the next sequence as shown in Table 1. Also on the second clock cycle, the output OUT of flip-flop 62 will remain low, the output of NAND gate 70 will remain high, and the output of inverter 72 will remain low.

On the third clock cycle, the output OUT of flip-flop 54 will transition from a low signal to a high signal, and the output OUT of flip-flop 60 will transition from a high signal to a low signal. Additionally, the output OUT of flip-flop 56 will transition from a high signal to a low signal caused by the high signal from the output OUT of flip-flop 60 being input to its toggle input (tog) on the second clock cycle. The output OUT of flip-flop 58 will not toggle, as the input to its toggle input (tog) from inverter 72 from the second clock cycle is a low signal. Thus, on the third clock cycle, the output count on output 52, from the most significant bit ($a_{in}3$) to the least significant bit ($a_{in}$) will be a binary 101 (decimal 5), i.e., the next sequence as shown in Table 1. Also on the third clock cycle, the output OUT of flip-flop 62 will transition from a low signal to a high signal (from the high toggle input (tog) from output OUT of flip-flop 60 on the second clock cycle), the output of NAND gate 70 will remain high, and the output of inverter 72 will remain low.

On the fourth clock cycle, the output OUT of flip-flop 54 will transition from a high signal to a low signal and the output OUT of flip-flop 60 will transition from a low signal to a high signal. Additionally, the outputs OUT of flip-flops 56 and 58 will not toggle, as the input to their toggle inputs (tog) from output OUT of flip-flop 60 and inverter 72, respectively, from the third clock cycle is a low signal. Thus, on the fourth clock cycle, the output count on output 52, from the most significant bit ($a_{in}3$) to the least significant bit ($a_{in}$) will be a binary 100 (decimal 4), i.e., the next sequence as shown in Table 1. The above process will continue, following the address sequence as illustrated in Table 1, until the last address sequence (binary 000, decimal 0) has been reached.

Now suppose, for example, a binary sequential burst access is desired. The signal lin 66 will be a high signal, i.e., a logic 1. The operation of circuit 80 will be as follows. The high inputs from the clock signal (clk) and load signal (load) will cause the output of NAND gate 90 to go low, thereby causing the output of inverter 92 to go high. The high output at inverter 92 will turn on transistors 88 and 88a, allowing the signals $a_{in}$ and $a_{in}2$ to be input to the NAND gates 82 and 82a respectively. If both the value for $a_{in}$ and $a_{in}2$ are a low logic signal, i.e., a binary 0, the outputs of NAND gates 82 and 82a will be a logic high. The high signal output from NAND gates 82, 82a are input to the first terminal of the multiplexers 68, 68a respectively and the input of the inverters 84, 84a respectively. The output of inverters 84, 84a will both be low, which is input to the second terminal of multiplexers 68, 68a. The combination of the high input at the first terminal of multiplexers 68, 68a and the low signal at the second terminal of multiplexers 68, 68a will cause multiplexers 68, 68a to pass only the signal being input to the first input of the multiplexers 68, 68a, i.e., the output OUT from flip-flops 60 and 62 respectively. Thus, as illustrated in Table 1, the addressing sequence when both $a_{in}$ and $a_{in}2$ are binary 0 is the same for both the sequential addressing mode and the interleave addressing mode.

Thus, suppose for example that the last three most significant bits, i.e $a_{in}3$, $a_{in}2$, and $a_{in}$, of a starting address for a burst access are the binary number 000. As illustrated in Table 1, the address sequence for both sequential binary addressing and interleave addressing is 0,1,2,3,4,5,6,7. At time $t_0$, the binary signals $a_{in}$, $a_{in}2$ and $a_{in}3$ are input to the address inputs (in) of flip-flops 54, 56 and 58, respectively, and a ground signal is input to the address inputs (in) of flip-flops 60, 62. On the first clock cycle, the inputs to each respective flip-flop will be carried through to the output OUT. Thus, the first count signal will be output on output 52 as binary 000 (decimal 0), as a binary 0 is the signal input to the address signal (in) for each flip-flop 54, 56, 58, and the memory chip responds with the data stored at the initial address. Also on the first clock cycle, the output OUT of flip-flops 60 and 62 will be a low signal, as their address inputs (in) are tied to ground. The low outputs on output OUT of flip-flops 60 and 62 are passed through multiplexers 68, 68a, respectively, as described above, and input to NAND gate 70. The output of NAND gate 70 will be high, which when inverted by inverter 72 will be input as a low signal to the toggle input (tog) of flip-flop 58. Sequential data will be available on each subsequent clock cycle as follows.

On the second clock cycle, the outputs OUT of flip-flops 54 and 60 will transition from a low signal to a high, as their toggle inputs (tog) are tied to Vcc and will therefor toggle on every clock cycle. The outputs OUT of flip-flops 56 and 58, having the low inputs at their address input (in) from the output OUT of flip-flop 60 and the inverter 72 when the second clock cycle occurs, will not toggle, i.e., they will remain in the same state, which is a low signal. Thus, on the second clock cycle, the output count on output 52, from the most significant bit ($a_{in}3$) to the least significant bit ($a_{in}$) will be a binary 001 (decimal 1), i.e., the next sequence as shown in Table 1. Also on the second clock cycle, the output OUT of flip-flop 62 will remain low, the output of NAND gate 70 will remain high, and the output of inverter 72 will remain low.

On the third clock cycle, the outputs OUT of flip-flops 54 and 60 will transition from a high signal to a low. Additionally, the output OUT of flip-flop 56 will transition from a low signal to a high signal caused by the high signal from the output OUT of flip-flop 60 being input to its toggle input (tog) on the second clock cycle. The output OUT of flip-flop 58 will not toggle, as the input to its toggle input (tog) from inverter 72 from the second clock cycle is a low signal. Thus, on the third clock cycle, the output count on output 52, from the most significant bit ($a_{in}3$) to the least significant bit ($a_{in}$) will be a binary 010 (decimal 2), i.e., the next sequence as shown in Table 1. Also on the third clock cycle, the output OUT of flip-flop 62 will transition from a low signal to a high signal (from the high toggle input (tog) from output OUT of flip-flop 60 on the second clock cycle), the output of NAND gate 70 will remain high, and the output of inverter 72 will remain low.

On the fourth clock cycle, the outputs OUT of flip-flops 54 and 60 will transition from a low signal to a high. The outputs OUT of flip-flops 56 and 58 will not toggle, as the input to their toggle inputs (tog) from output OUT of flip-flop 60 and inverter 72, respectively, from the third clock cycle is a low signal. Thus, on the fourth clock cycle, the output count on output 52, from the most significant bit ($a_{in}3$) to the least significant bit ($a_{in}$) will be a binary 011 (decimal 3), i.e., the next sequence as shown in Table 1. The above process will continue, following the address sequence as illustrated in Table 1, until the last address sequence (binary 111, decimal 7) has been reached.

If the value for $a_{in}$ is a binary 1, circuit 80 operates to cause multiplexer 68 to pass only the output OUT_ from flip-flop 60 as follows. When $a_{in}$ is a binary 1, the output of NAND gate 82 will be a low signal. The low signal output from NAND gate 82 is input to the first terminal of the multiplexer 68 and the input of the inverter 84. The output of inverter 84 will be high, which is input to the second terminal of multiplexer 68. The combination of the low input at the first terminal of multiplexer 68 and the high signal at the second terminal of multiplexer 68 will cause multiplexer 68 to pass only the signal being input to the second input of the multiplexer 68, i.e., the output OUT_ from flip-flop 60.

The low output from NAND gate 82 will be latched, thus maintaining the passage of the output OUT_ from flip-flop 60 through multiplexer 68 as follows. Recall that the load signal goes high synchronously with the clock signal (clk) when a new read or write command is being performed, i.e., when a new starting address is being input to the system. Thus, the load signal (load) will transition low on the next clock cycle after a new starting address is input. When the load signal (load) goes low, the output from NAND gate 90 will go high, causing the output of inverter 92 to go low. Transistors 88 and 88a will turn off, and transistors 86 and 86a will turn on. When transistor 86 turns on, the high signal from the output of inverter 84 will be input to NAND gate 82, thus maintaining the output of NAND gate 82 in a low logic state. Transistor 86 will remain on until the load signal (load) goes high, indicating a new starting address is being input, at which time transistor 88 will turn on again.

Similarly, if the value for $a_{in}2$ is a binary 1, then multiplexer 68a will pass only the output OUT_ from flip-flop 62 as follows. When $a_{in}2$ is a binary 1, the output of NAND gate 82a will be a low signal. The low signal output from NAND gate 82a is input to the first terminal of the multiplexer 68a and the input of the inverter 84a. The output of inverter 84a will be high, which is input to the second terminal of multiplexer 68a. The combination of the low input at the first terminal of multiplexer 68a and the high signal at the second terminal of multiplexer 68a will cause multiplexer 68a to pass only the signal being input to the second input of the multiplexer 68a, i.e., the output OUT_ from flip-flop 62. The output of NAND gate 82a is latched similarly as that of NAND gate 82 described above.

For example, suppose the last three most significant bits, i.e., $a_{in}3$, $a_{in}2$, and $a_{in}$, of a starting address for a burst access are the binary number 011. As illustrated in Table 1, the address sequence for binary sequencing is 3,4,5,6,7,0,1,2. At time $t_0$, the binary signals $a_{in}$, $a_{in}2$ and $a_{in}3$ are input to the address inputs (in) of flip-flops 54, 56 and 58, respectively, and a ground signal is input to the address inputs (in) of flip-flops 60, 62. On the first clock cycle, the inputs to each respective flip-flop will be carried through to the output OUT. Thus, the first count signal will be output on output 52 as binary 011 (decimal 3), and the memory chip responds with the data stored at the initial address. Also on the first clock cycle, the output OUT of flip-flops 60 and 62 will be a low signal, as their address inputs (in) are tied to ground. Consequently, the output OUT_ of flip-flops 60 and 62 will be high. The high outputs on output OUT_ of flip-flops 60 and 62 are passed through multiplexers 68, 68a, respectively, as described above, and input to NAND gate 70. The output of NAND gate 70 will be low, which when inverted by inverter 72 will be input as a high signal to the toggle input (tog) of flip-flop 58. Sequential data will be available on each subsequent clock cycle as follows.

On the second clock cycle, the output OUT of flip-flops 54 will transition from a high signal to a low. The output OUT_ of flip-flip 60 will also transition from a high signal to a low signal. The outputs OUT of flip-flops 56 and 58, having the high inputs at their address input (in) from the output OUT_ of flip-flop 60 and the inverter 72 when the second clock cycle occurs will toggle, i.e., the output OUT of flip-flop 56 will transition from a high signal to a low signal, and the output OUT of flip-flop 58 will transition from a low signal to a high signal. Thus, on the second clock cycle, the output count on output 52, from the most significant bit ($a_{in}3$) to the least significant bit ($a_{in}$) will be a binary 100 (decimal 4), i.e., the next sequence as shown in Table 1. Also on the second clock cycle, the output OUT_ of flip-flop 62 will remain high, the output of NAND gate 70 will remain low, and the output of inverter 72 will remain high.

On the third clock cycle, the output OUT of flip-flop 54 will transition from a low signal to a high signal. The output OUT_ of flip-flop 60 will transition from a low signal to a high signal. The output OUT of flip-flop 56 will not toggle, i.e., it will remain as a low signal, caused by the low signal from the output OUT_ of flip-flop 60 being input to its toggle input (tog) on the second clock cycle. The output OUT of flip-flop 58 will not toggle, i.e., it will remain a high signal, as the input to its toggle input (tog) from inverter 72 from the second clock cycle is a low signal. Thus, on the third clock cycle, the output count on output 52, from the most significant bit ($a_{in}3$) to the least significant bit ($a_{in}$) will be a binary 101 (decimal 5), i.e., the next sequence as shown in Table 1. Also on the third clock cycle, the output OUT_ of flip-flop 62 will transition from a high signal to a low signal (from the high toggle input (tog) from output OUT of flip-flop 60 on the second clock cycle), the output of NAND gate 70 will transition from a low signal to a high signal, and the output of inverter 72 will transition from a high signal to a low signal.

On the fourth clock cycle, the output OUT of flip-flop 54 will transition from a high signal to a low signal. The output OUT_ of flip-flop 60 will transition from a high signal to a low signal. The output OUT of flip-flop 58 will not toggle, as the input to its toggle input (tog) from inverter 72 from the third clock cycle is a low signal. The output OUT of flip-flop 56 will transition from a low signal to a high signal by the high input form output OUT_ of flip-flop 60 from the third clock cycle. Thus, on the fourth clock cycle, the output count on output 52, from the most significant bit ($a_{in}3$) to the least significant bit ($a_{in}$) will be a binary 110 (decimal 6), i.e., the next sequence as shown in Table 1. The above process will continue, following the address sequence as illustrated in Table 1, until the last address sequence (binary 010, decimal 2) has been reached.

Thus, in accordance with the present invention, a programmable counter circuit for use in semiconductor memories for generating both sequential and interleave address sequences for block data accesses is provided.

Figure 3:
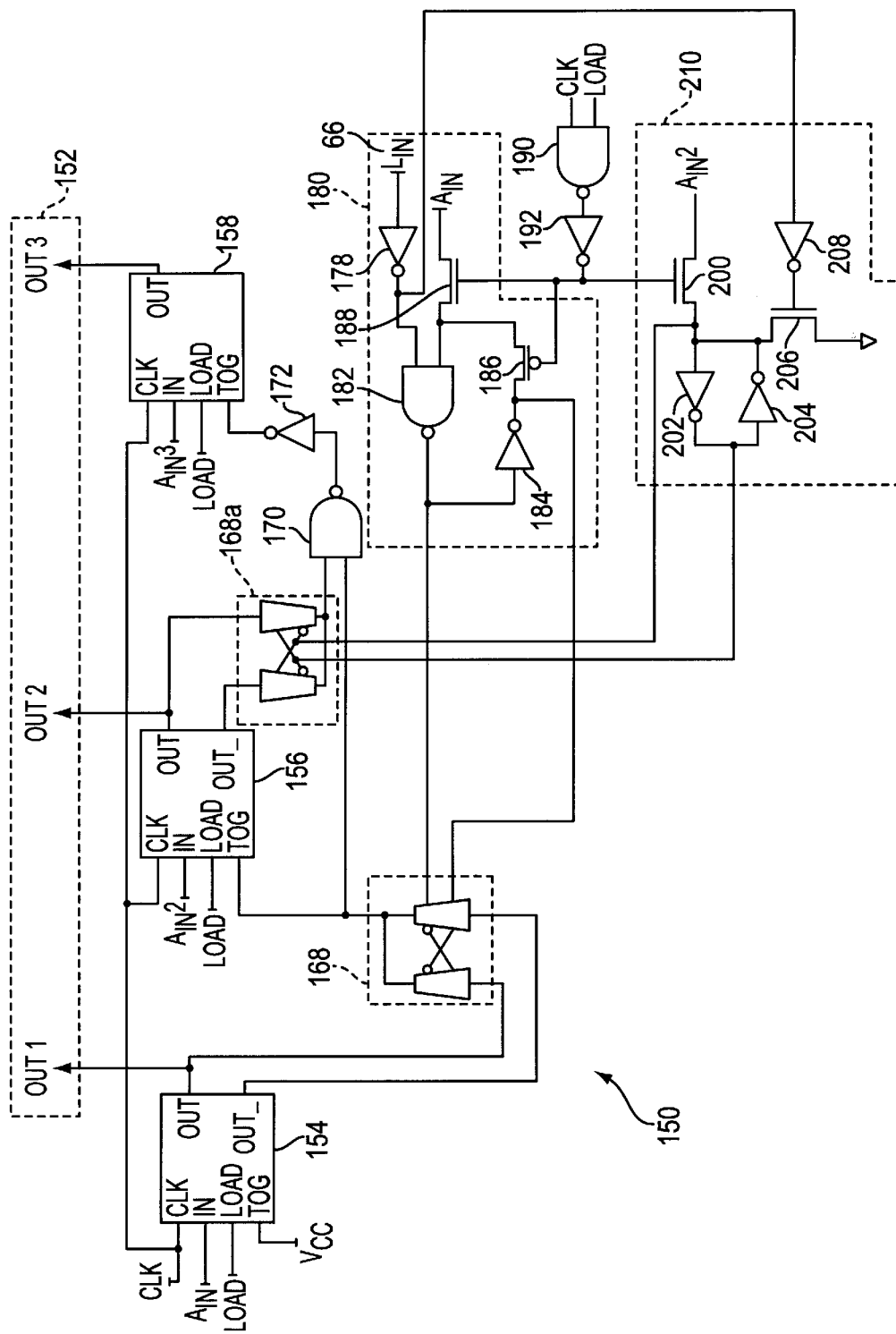
FIG. 3 illustrates in schematic diagram form a counter circuit in accordance with another embodiment of the present invention.

FIG. 3 illustrates in schematic diagram form a counter circuit 150 in accordance with another embodiment of the present invention. Counter circuit 150 could be used in place of counter 34 of FIG. 1 to provide improved address generation. Circuit 150 is preferably part of an integrated circuit, preferably a semiconductor memory device. The output 152 of circuit 150 is the count signal provided to address latch 32.

Circuit 150 includes three flip-flops 154, 156 and 158. Flip-flops 154, 156 and 158 function as a counter and store the current count value and also generate the sequential or interleave carry bit. The address sequence, i.e., sequential or interleave, is based on a control signal (lin) input 66 to the circuit 150 as further described below. Each flip-flop 154, 156, 158 is provided with four inputs, a clock input (clk), an address input (in), a load input (load) and a toggle input (tog). The clock (clk) input of each flip-flop 154, 156, 158 is connected to receive a system clock signal. The load input (load) of each flip-flop 154, 156, 158 is connected to receive a load signal (described below). The address input (in) of flip-flop 154 is connected to receive a signal $a_{in}$, which is the least most significant bit of the access starting address of the memory device. The address input (in) of flip-flop 156 is connected to receive a signal $a_{in}2$, which is the next most significant bit of the access starting address after $a_{in}$, and the address input (in) of flip-flop 158 is connected to receive a signal $a_{in}3$, which is the next most significant bit of the access starting address after $a_{in}2$.

The output (OUT) of flip-flops 154, 156 and 158 are provided to the output 152 of circuit 150, which as noted above is the count signal provided to address latch 32. The output (OUT) and complementary output (OUT_) of flip-flop 154 are input to the first and second inputs, respectively, of a multiplexer 168 while the output (OUT) and complementary output (OUT_) of flip-flop 156 are input to the first and second, respectively, of a multiplexer 168a. The output from multiplexer 168 is input to the toggle (tog) input of flip-flop 156 and to a first input of a NAND gate 170. The output from multiplexer 168a is input to the second input of NAND gate 170. The output of NAND gate 170 is inverted by inverter 172 and input to the toggle (tog) input of flip-flop 158.

The operation of multiplexers 168 and 168a, i.e., whether the signal OUT or OUT_ of flip-flops 154 and 156 will be passed through each multiplexer 168 and 168a, is controlled by circuits 180 and 210, respectively. Circuit 180 includes a NAND gate 182, having a first input connected to an output of inverter 178. The input of inverter 178 is coupled to receive control signal lin 66. The state of control signal lin 66 determines whether a sequential or interleave burst mode carry bit will be generated. If lin 66 is a low signal, i.e., a logic 0, the circuit 150 will count in interleave mode. Conversely, if lin 66 is a high signal, i.e., a logic 1, the circuit 150 will count in sequential mode. The second input of NAND gate 182 is connected to the address signal $a_{in}$ through a transistor 188. The output of NAND gate 182 is connected to a first terminal of multiplexer 168 and to the input of an inverter 184. The output of inverter 184 is connected to a first terminal of a P-channel transistor 186 and also to a second terminal of multiplexer 168. The second terminal of transistor 186 is connected to the second input of NAND gate 182. The gate of transistor 186 is connected to the gate of transistor 188, which is connected to the output of an inverter 192. The input of inverter 192 is connected to the output of NAND gate 190, which has a first input connected to receive the clock (clk) signal and a second input connected to receive the load (load) signal. The load signal goes high synchronously with the clock signal (clk) when a new read or write command is being performed, i.e., when a new starting address is being input to the system. Thus, the load signal (load) will remain low unless an initial address is being input to the circuit.

Circuit 210 includes a transistor 200 having a first terminal coupled to the address signal $a_{in}2$. The gate of transistor 200 is connected to the output of inverter 192. The second terminal of transistor 200 is connected to a second terminal of multiplexer 168a and also to the input of an inverter 202. The output of inverter 202 is connected to the first terminal of multiplexer 168a and also to the input of inverter 204. The output of inverter 204 is connected to a first terminal of transistor 206. The second terminal of transistor 206 is coupled to ground, and the gate of transistor 206 is connected to the output of inverter 208. The input of inverter 208 is connected to the output of inverter 178.

The operation of the circuit 150 will now be described. When a new read or write burst command is requested, the signal load (load) will go high synchronously with the clock signal (clk) going high. When the load signal goes high, each of the flip-flops 154, 156, 158 will be reset. The high inputs from the clock signal (clk) and load signal (load) will cause the output of NAND gate 190 to go low, thereby causing the output of inverter 192 to go high. The high output at inverter 192 will turn on transistor 188, allowing the signal $a_{in}$ to be input to the NAND gate 182. The high output at inverter 192 will also turn on transistor 200, allowing the signal $a_{in}2$ to be input to the first terminal of multiplexer 168a and the input of inverter 202. The three least most significant bits of the starting address, i.e., $a_{in}$, $a_{in}2$ and $a_{in}3$ will be input to the address inputs (in) of the flips-flops 154, 156 and 158, respectively to initialize each of the flip-flops.

The toggle input (tog) of flip-flop 154, which produces the least most significant bit of the output count 152, is connected to a voltage potential, typically Vcc, and therefore the output of flip-flop 154 will toggle with every clock cycle.

Suppose for example an interleave burst access is desired. The signal lin 66 will be a low signal, i.e., a logic 0. The operation of circuit 180 will be as follows. The input of the low signal lin 66 to the inverter 178 will cause a high signal on the output of inverter 178. The high signal from inverter 178 is input to the first input of NAND gate 182. If the value for $a_{in}$ is a binary 1, the output of NAND gate 182 will be a low signal, which is input to the first terminal of multiplexer 168 and the input of inverter 184. The output of inverter 184 will be high, which is input to the second terminal of multiplexer 168. The combination of the low input at the first terminal of multiplexer 168 and the high input at the second terminal of multiplexer 168 will cause multiplexer 168 to pass only the signal being input to the second input of multiplexer 168, i.e., the output OUT_ from flip-flop 154.

If $a_{in}$ is a binary 0, the output from NAND gate 182 will be a high signal. The high signal output from NAND gate 182 is input to the first terminal of the multiplexer 168 and the input of the inverter 184. The output of inverter 184 will be low, which is input to the second terminal of multiplexer 168. The combination of the high input at the first terminal of multiplexer 168 and the low input at the second terminal of multiplexer 168 will cause multiplexer 168 to pass only the signal being input to the first input of the multiplexer 168, i.e., the output OUT from flip-flop 154.

The operation of circuit 210 for an interleave access is as follows. Recall that transistor 200 is turned on by the high signal from the output of inverter 192 and thus will pass the signal $a_{in}2$ to the second terminal of multiplexer 168a and the input of inverter 202. If $a_{in}2$ is a binary 1, a high signal will be input to the second terminal of multiplexer 168a and the input of inverter 202. The output of inverter 202 will be a low signal, which is input to the first terminal of multiplexer 168a and the input of inverter 204. The input to inverter 208 from the output of inverter 178 will go high, causing inverter 208 to output a low signal and maintaining transistor 206 in an off state. The output from inverter 204 will be high, which is input back to inverter 202. Thus, circuit 210 will operate as a latch to keep the second terminal of multiplexer 168a high and the first terminal of multiplexer 168a low. The combination of the low input at the first terminal of multiplexer 168a and the high input at the second terminal of multiplexer 168a will cause multiplexer 168a to pass only the signal being input to the second input of the multiplexer 168a, i.e., the output OUT_ from flip-flop 156.

If $a_{in}2$ is a binary 0, a low signal will be input to the second terminal of multiplexer 168a and the input of inverter 202. The output of inverter 202 will be a high signal, which is input to the first terminal of multiplexer 168a and the input of inverter 204. The input to inverter 208 from the output of inverter 178 will high, causing inverter 208 to output a low signal and maintaining transistor 206 in an off state. The output from inverter 204 will be low, which is input back to inverter 202. Thus, circuit 210 will operate as a latch to keep the first terminal of multiplexer 168a high and the second terminal of multiplexer 168a low. The combination of the high input at the first terminal of multiplexer 168a and the low input at the second terminal of multiplexer 168a will cause multiplexer 168a to pass only the signal being input to the first input of the multiplexer 168a, i.e., the output OUT from flip-flop 156.

For example, suppose the last three most significant bits, i.e., $a_{in}3$, $a_{in}2$, and $a_{in}$ of a starting address for a burst access are the binary number 111. As illustrated in Table 1, the interleave address sequence is 7,6,5,4,3,2,1,0. At time $t_0$, the binary signals $a_{in}$, $a_{in}2$ and $a_{in}3$ are input to the address inputs (in) of flip-flops 154, 156 and 158, respectively. On the first clock cycle, the inputs to each respective flip-flop will be carried through to the output OUT. Thus, the first count signal will be output on output 152 as binary 111 (decimal 7), as a binary 1 is the signal input to the address signal (in) for each flip-flop 154, 156, 158, and the memory chip responds with the data stored at the initial address. Also on the first clock cycle, the outputs OUT_ of flip-flops 154 and 156 will be a low signal. The low output on outputs OUT_ of flip-flops 154 and 156 are passed through multiplexers 168, 168a, respectively, as described above, and input to NAND gate 170. The output of NAND gate 170 will be high, which when inverted by inverter 172 will be input as a low signal to the toggle input (tog) of flip-flop 158. Sequential data will be available on each subsequent clock cycle as follows.

On the second clock cycle, the output OUT of flip-flop 154 will transition from a high signal to a low signal as its toggle input (tog) is tied to Vcc and will therefor toggle on every clock cycle. The outputs OUT of flip-flops 156 and 158, having the low input to their toggle inputs (tog), will not toggle, i.e., they will remain in the same state, which is a high signal. Thus, on the second clock cycle, the output count on output 152, from the most significant bit ($a_{in}3$) to the least significant bit ($a_{in}$) will be a binary 110 (decimal 6), i.e., the next sequence as shown in Table 1. Also on the second clock cycle, the output of NAND gate 170 will remain high, and the output of inverter 172 will remain low.

On the third clock cycle, the output OUT of flip-flop 154 will transition from a low signal to a high signal. Additionally, the output OUT of flip-flop 156 will transition from a high signal to a low signal caused by the high signal from the multiplexer 168 being input to its toggle input (tog) on the second clock cycle. The output OUT of flip-flop 158 will not toggle, as the input to its toggle input (tog) from inverter 172 from the second clock cycle is a low signal. Thus, on the third clock cycle, the output count on output 152, from the most significant bit ($a_{in}3$) to the least significant bit ($a_{in}$) will be a binary 101 (decimal 5), i.e., the next sequence as shown in Table 1. Also on the third clock cycle, the, the output of NAND gate 170 will remain high, and the output of inverter 172 will remain low.

On the fourth clock cycle, the output OUT of flip-flop 154 will transition from a high signal to a low signal. Additionally, the outputs OUT of flip-flops 156 and 158 will not toggle, as the input to their toggle inputs (tog) from multiplexer 168 and inverter 172, respectively, from the third clock cycle is a low signal. Thus, on the fourth clock cycle, the output count on output 152, from the most significant bit ($a_{in}3$) to the least significant bit ($a_{in}$) will be a binary 100 (decimal 4), i.e., the next sequence as shown in Table 1. The above process will continue, following the address sequence as illustrated in Table 1, until the last address sequence (binary 000, decimal 0) has been reached.

Now suppose, for example, the last three most significant bits, i.e., $a_{in}3$, $a_{in}2$, and $a_{in}$ of a starting address for a burst access are the binary number 000. As illustrated in Table 1, the interleave address sequence is 0,1,2,3,4,5,6,7. As described above, if $a_{in}$ is a binary 0, circuit 180 will operate to cause multiplexer 168 to pass only the signal being input to the first input of the multiplexer 168, i.e., the output OUT from flip-flop 154. Similarly, if $a_{in}2$ is a binary 0, circuit 210 will operate to cause multiplexer 168a to pass only the signal being input to the second input of multiplexer 168a, i.e., the output OUT from flip-flop 156.

At time $t_0$, the binary signals $a_{in}$, $a_{in}2$ and $a_{in}3$ are input to the address inputs (in) of flip-flops 154, 156 and 158, respectively. On the first clock cycle, the inputs to each respective flip-flop will be carried through to the output OUT. Thus, the first count signal will be output on output 152 as binary 000 (decimal 0), as a binary 0 is the signal input to the address signal (in) for each flip-flop 154, 156, 158, and the memory chip responds with the data stored at the initial address. Also on the first clock cycle, the low output on outputs OUT of flip-flops 154 and 156 are passed through multiplexers 168, 168a, respectively, as described above, and input to NAND gate 170. The output of NAND gate 170 will be high, which when inverted by inverter 172 will be input as a low signal to the toggle input (tog) of flip-flop 158. Sequential data will be available on each subsequent clock cycle as follows.

On the second clock cycle, the output OUT of flip-flop 154 will transition from a low signal to a high signal as its toggle input (tog) is tied to Vcc and will therefor toggle on every clock cycle. The outputs OUT of flip-flops 156 and 158, having the low input to their toggle inputs (tog), will not toggle, i.e., they will remain in the same state, which is a low signal. Thus, on the second clock cycle, the output count on output 152, from the most significant bit ($a_{in}3$) to the least significant bit ($a_{in}$) will be a binary 001 (decimal 1), i.e., the next sequence as shown in Table 1. Also on the second clock cycle, the output of NAND gate 170 will remain high, and the output of inverter 172 will remain low.

On the third clock cycle, the output OUT of flip-flop 154 will transition from a high signal to a low signal. Additionally, the output OUT of flip-flop 156 will transition from a low signal to a high signal caused by the high signal from the multiplexer 168 being input to its toggle input (tog) on the second clock cycle. The output OUT of flip-flop 158 will not toggle, as the input to its toggle input (tog) from inverter 172 from the second clock cycle is a low signal. Thus, on the third clock cycle, the output count on output 152, from the most significant bit ($a_{in}3$) to the least significant bit ($a_{in}$) will be a binary 010 (decimal 2), i.e., the next sequence as shown in Table 1. Also on the third clock cycle, the, the output of NAND gate 170 will remain high, and the output of inverter 172 will remain low.

On the fourth clock cycle, the output OUT of flip-flop 154 will transition from a low signal to a high signal. Additionally, the outputs OUT of flip-flops 156 and 158 will not toggle, as the input to their toggle inputs (tog) from multiplexer 168 and inverter 172, respectively, from the third clock cycle is a low signal. Thus, on the fourth clock cycle, the output count on output 152, from the most significant bit ($a_{in}3$) to the least significant bit ($a_{in}$) will be a binary 011 (decimal 3), i.e., the next sequence as shown in Table 1. The above process will continue, following the address sequence as illustrated in Table 1, until the last address sequence (binary 111, decimal 7) has been reached.

Now suppose, for example a sequential (binary) burst access is desired. The signal lin 66 will be a high signal, i.e., a logic 1. The operation of circuit 180 will be as follows. The input of the high signal lin 66 to the inverter 178 will cause a low signal on the output of inverter 178. The low signal from inverter 178 input to the first input of NAND gate 182 will produce a high signal at the output of NAND gate 182, regardless of the state of the signal $a_{in}$ that is input to the second input of NAND gate 182. The high signal output from NAND gate 182 is input to the first terminal of the multiplexer 168 and the input of the inverter 184. The output of inverter 184 will be low, which is input to the second terminal of multiplexer 168. The combination of the high input at the first terminal of multiplexer 168 and the low input at the second terminal of multiplexer 168 will cause multiplexer 168 to pass only the signal being input to the first input of the multiplexer 168, i.e., the output OUT from flip-flop 154.

The operation of circuit 210 for a sequential (binary) access is as follows. The input to inverter 208 from the output of inverter 178 will be low, causing inverter 208 to output a high signal and turn transistor 206 on, connecting the input of inverter 202 and the second terminal of multiplexer 168a to a low signal, i.e., ground. The output of inverter 202 will be a high signal, which is input to the first terminal of multiplexer 168a and the input of inverter 204. The output from inverter 204 will be low, which is input back to inverter 202. Thus, circuit 210 will operate as a latch to keep the second terminal of multiplexer 168a low and the first terminal of multiplexer 168a high, regardless of the state of the signal $a_{in}2$. The combination of the high input at the first terminal of multiplexer 168a and the low input at the second terminal of multiplexer 168a will cause multiplexer 168a to pass only the signal being input to the first input of the multiplexer 168a, i.e., the output OUT from flip-flop 156.

Thus, suppose for example the last three most significant bits, i.e., $a_{in}3$, $a_{in}2$, and $a_{in}$, of a starting address for a burst sequence are the binary number 111. As illustrated in Table 1, the sequential (binary) address sequence is 7,0,1,2,3,4,5,6. At time $t_0$, the binary signals $a_{in}$, $a_{in}2$ and $a_{in}3$ are input to the address inputs (in) of flip-flops 154, 156 and 158, respectively. On the first clock cycle, the inputs to each respective flip-flop will be carried through to the output OUT. Thus, the first count signal will be output on output 152 as binary 111 (decimal 7), as a binary 1 is the signal input to the address signal (in) for each flip-flop 154, 156, 158, and the memory chip responds with the data stored at the initial address. Also on the first clock cycle, the high output on outputs OUT of flip-flops 154 and 156 are passed through multiplexers 168, 168a, respectively, as described above, and input to NAND gate 170. The output of NAND gate 170 will be low, which when inverted by inverter 172 will be input as a high signal to the toggle input (tog) of flip-flop 158. Sequential data will be available on each subsequent clock cycle as follows.

On the second clock cycle, the output OUT of flip-flop 154 will transition from a high signal to a low signal as its toggle input (tog) is tied to Vcc and will therefor toggle on every clock cycle. The outputs OUT of flip-flops 156 and 158, having the high input to their toggle inputs (tog), will toggle, i.e., they will transition from a high signal to a low signal. Thus, on the second clock cycle, the output count on output 152, from the most significant bit ($a_{in}3$) to the least significant bit ($a_{in}$) will be a binary 000 (decimal 0), i.e., the next sequence as shown in Table 1. Also on the second clock cycle, the output of NAND gate 170 will transition from low to high, and the output of inverter 172 will transition from high to low.

On the third clock cycle, the output OUT of flip-flop 154 will transition from a low signal to a high signal.

Additionally, the output OUT of flip-flop 156 will not toggle, i.e., remain in a low state, caused by the low signal from the multiplexer 168 being input to its toggle input (tog) on the second clock cycle. The output OUT of flip-flop 158 will not toggle, as the input to its toggle input (tog) from inverter 172 from the second clock cycle is a low signal. Thus, on the third clock cycle, the output count on output 152, from the most significant bit ($a_{in}3$) to the least significant bit ($a_{in}$) will be a binary 001 (decimal 1), i.e., the next sequence as shown in Table 1. Also on the third clock cycle, the, the output of NAND gate 170 will remain high, and the output of inverter 172 will remain low.

On the fourth clock cycle, the output OUT of flip-flop 154 will transition from a high signal to a low signal. The output OUT of flip-flop 156 will transition from a low signal to a high signal, as the input to its toggle input (tog) from multiplexer 168 from the third clock cycle is a high signal. The output OUT of flip-flop 158 will not toggle, as the input to its toggle input (tog) from inverter 172 from the third clock cycle is a low signal. Thus, on the fourth clock cycle, the output count on output 152, from the most significant bit ($a_{in}3$) to the least significant bit ($a_{in}$) will be a binary 010 (decimal 2), i.e., the next sequence as shown in Table 1. The above process will continue, following the address sequence as illustrated in Table 1, until the last address sequence (binary 110, decimal 6) has been reached.

Now suppose, for example, the last three most significant bits, i.e., $a_{in}3$, $a_{in}2$, and $a_{in}$, of a starting address for a burst access are the binary number 000. As illustrated in Table 1, the sequential (binary) address sequence is 0,1,2,3,4,5,6,7. As described above, when a sequential address sequence is desired, signal lin 66 will be high, and thus circuit 180 will operate to cause multiplexer 168 to pass only the signal being input to the first input of the multiplexer 168, i.e., the output OUT from flip-flop 154. Similarly, circuit 210 will operate to cause multiplexer 168a to pass only the signal being input to the second input of multiplexer 168a, i.e., the output OUT from flip-flop 156.

At time $t_0$, the binary signals $a_{in}$, $a_{in}2$ and $a_{in}3$ are input to the address inputs (in) of flip-flops 154, 156 and 158, respectively. On the first clock cycle, the inputs to each respective flip-flop will be carried through to the output OUT. Thus, the first count signal will be output on output 152 as binary 000 (decimal 0), as a binary 0 is the signal input to the address signal (in) for each flip-flop 154, 156, 158, and the memory chip responds with the data stored at the initial address. Also on the first clock cycle, the low output on outputs OUT of flip-flops 154 and 156 are passed through multiplexers 168, 168a, respectively, as described above, and input to NAND gate 170. The output of NAND gate 170 will be high, which when inverted by inverter 172 will be input as a low signal to the toggle input (tog) of flip-flop 158. Sequential data will be available on each subsequent clock cycle as follows.

On the second clock cycle, the output OUT of flip-flop 154 will transition from a low signal to a high signal as its toggle input (tog) is tied to Vcc and will therefor toggle on every clock cycle. The outputs OUT of flip-flops 156 and 158, having the low input to their toggle inputs (tog), will not toggle, i.e., they will remain in the same state, which is a low signal. Thus, on the second clock cycle, the output count on output 152, from the most significant bit ($a_{in}3$) to the least significant bit ($a_{in}$) will be a binary 001 (decimal 1), i.e., the next sequence as shown in Table 1. Also on the second clock cycle, the output of NAND gate 170 will remain high, and the output of inverter 172 will remain low.

On the third clock cycle, the output OUT of flip-flop 154 will transition from a high signal to a low signal. Additionally, the output OUT of flip-flop 156 will transition from a low signal to a high signal caused by the high signal from the multiplexer 168 being input to its toggle input (tog) on the second clock cycle. The output OUT of flip-flop 158 will not toggle, as the input to its toggle input (tog) from inverter 172 from the second clock cycle is a low signal. Thus, on the third clock cycle, the output count on output 152, from the most significant bit ($a_{in}3$) to the least significant bit ($a_{in}$) will be a binary 010 (decimal 2), i.e., the next sequence as shown in Table 1. Also on the third clock cycle, the, the output of NAND gate 170 will remain high, and the output of inverter 172 will remain low.

On the fourth clock cycle, the output OUT of flip-flop 154 will transition from a low signal to a high signal. Additionally, the outputs OUT of flip-flops 156 and 158 will not toggle, as the input to their toggle inputs (tog) from multiplexer 168 and inverter 172, respectively, from the third clock cycle is a low signal. Thus, on the fourth clock cycle, the output count on output 152, from the most significant bit ($a_{in}3$) to the least significant bit ($a_{in}$) will be a binary 011 (decimal 3), i.e., the next sequence as shown in Table 1. The above process will continue, following the address sequence as illustrated in Table 1, until the last address sequence (binary 111, decimal 7) has been reached.

Thus, in accordance with the present invention, a programmable counter circuit for use in semiconductor memories for generating both sequential and interleave address sequences for block data accesses is provided. The counter circuit according to the present invention can be programmed to automatically increment the memory address in both a binary and interleave sequence in order to increase the access speed for blocks of sequential data in semiconductor memories.

Figure 4:
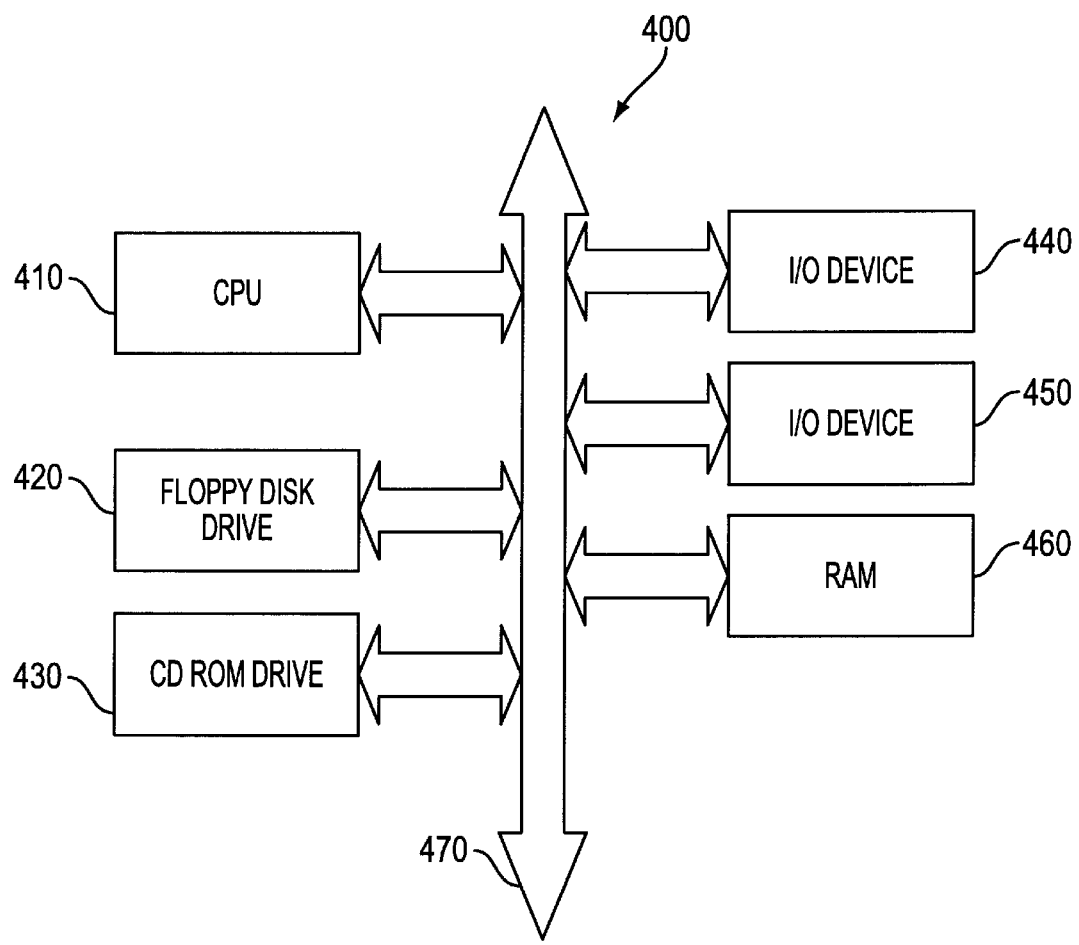
FIG. 4 illustrates in block diagram form a processor system including a memory device having a counter circuit in accordance with the present invention.

A typical processor based system which includes integrated circuits that utilize a counter circuit according to the present invention is illustrated generally at 400 in FIG. 4. A computer system is exemplary of a system having integrated circuits, such as for example memory circuits. Most conventional computers include memory devices permitting storage of significant amounts of data. The data is accessed during operation of the computers. Other types of dedicated processing systems, e.g., radio systems, television systems, GPS receiver systems, telephones and telephone systems also contain memory devices that can utilize the present invention.

A processor based system, such as a computer system, for example, generally comprises a central processing unit (CPU) 410, for example, a microprocessor, that communicates with one or more input/output (I/O) devices 440, 450 over a bus 470. The computer system 400 also includes random access memory (RAM) 460, and, in the case of a computer system may include peripheral devices such as a floppy disk drive 420 and a compact disk (CD) ROM drive 430 which also communicate with CPU 410 over the bus 470. RAM 460 is preferably constructed as an integrated circuit which includes a counter circuit as previously described with respect to FIGS. 2 or 3. It may also be desirable to integrate the processor 410 and memory 460 on a single IC chip.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A circuit for generating a plurality of addresses in a memory array from a single address input comprising:

a first control circuit having a first input connected to receive a mode select input signal and a second input connected to receive one bit of said single address input;

a second control circuit having a first input connected to receive a complement signal of said mode select input signal and a second input connected to receive another bit of said single address input; and a counter circuit having a first and second input connected to a first and second output, respectively, of said first control circuit and a third and fourth input connected to a first and second output, respectively, of said second control circuit, wherein said first and second control circuits provide signals for use by said counter circuit to generate said plurality of addresses based on said mode select input signal.

2. The circuit according to claim 1, wherein a first mode select signal generates said plurality of addresses in an interleave sequence.

3. The circuit according to claim 2, wherein a second mode select signal generates said plurality of addresses in a binary sequence.

4. The circuit according to claim 1, wherein said one bit of said single address input is the least significant bit of said single address input.

5. The circuit according to claim 4, wherein said another bit of said single address input is the next most significant bit after said least significant bit of said single address input.

6. The circuit according to claim 1, wherein said first control circuit further comprises:

a first logic gate having an input connected to receive said mode select input signal and an output;

a first transistor having a first terminal connected to receive said one bit of said single address input, a second terminal, and a gate terminal connected to receive a first control signal input;

a second logic gate having a first input connected to said output of said first logic gate, a second input connected to said second terminal of said first transistor, and an output connected to said first output of said first control circuit;

a third logic gate having an input connected to said output of said second logic gate, and an output connected to said second output of said first control circuit; and a second transistor having a first terminal connected to said output of said third logic gate, a second terminal connected to said second terminal of said first transistor, and a gate terminal connected to said gate terminal of said first transistor.

7. The circuit according to claim 6, wherein said first logic gate is an inverter.

8. The circuit according to claim 7, wherein said second logic gate is a NAND gate.

9. The circuit according to claim 8, wherein said third logic gate is an inverter.

10. The circuit according to claim 6, wherein said second transistor is a P-channel transistor.

11. The circuit according to claim 6, wherein said second control circuit further comprises:

a third transistor having a first terminal connected to receive said another bit of said single address input, a second terminal connected to said first output of said second control circuit, and a gate terminal connected to receive said first control signal input;

a fourth logic gate having a first input connected to said output of said first logic gate and an output;

a fifth logic gate having an input connected to said output of said fourth logic gate, and an output connected to said second output of said second control circuit;

a sixth logic gate having an input connected to said output of said fifth logic gate and an output connected to said input of said fifth logic gate; and a fourth transistor having a first terminal connected to said output of said sixth logic gate, a second terminal connected to a voltage potential, and a gate terminal connected to said output of said fourth logic gate.

12. The circuit according to claim 11, wherein said fourth, fifth and sixth logic gates are inverters.

13. The circuit according to claim 12, wherein said voltage potential is a ground potential.

14. The circuit according to claim 11, further comprising:

a seventh logic gate having a first input connected to receive a clock signal, a second input connected to receive a load signal, and an output; and an eighth logic gate having an input connected to said output of said seventh logic gate, and an output connected to said gate terminal of said first and third transistors to provide said first control signal input based on said clock signal and said load signal.

15. The circuit according to claim 14, wherein said seventh logic gate is a NAND gate.

16. The circuit according to claim 15, wherein said eighth logic gate is an inverter.

17. The circuit according to claim 1, wherein said counter circuit further comprises:

a first multiplexer having an output, a first control input connected to said first output of said first control circuit, a second control input connected to said second output of said first control circuit, and a first and second signal input; and a second multiplexer having an output, a first control input connected to said first output of said second control circuit, a second control input connected to said second output of said second control circuit, and a first and second signal input.

18. The circuit according to claim 17, wherein said counter circuit further comprises:

a plurality of flip-flops each having a first and second output, the first output providing a respective count bit to a count output, each flip-flop having a respective toggle input, said first and second output of a first of said plurality of flip-flops being connected, respectively, to said first and second signal input of said first multiplexer, said first and second output of a second of said plurality of flip-flops being connected, respectively, to said first and second signal input of said second multiplexer, and said toggle input of said second of said plurality of flip-flops being connected to said output of said first multiplexer.

19. The circuit according to claim 18, further comprising:

a ninth logic gate having a first input connected to said output of said first multiplexer, a second input connected to said output of said second multiplexer, and an output connectable to a toggle input of a third of said plurality of flip-flops.

20. The circuit according to claim 19, further comprising:
an inverter connected between said output of said logic gate and said toggle input of said third of said plurality of flip-flops.

21. A memory device comprising:
a plurality of memory arrays; and
a circuit for generating a plurality of addresses in said memory arrays from a single address input, said circuit comprising:
a first control circuit having a first input connected to receive a mode select input signal and a second input connected to receive one bit of said single address input;
a second control circuit having a first input connected to receive a complement signal of said mode select input signal and a second input connected to receive another bit of said single address input; and
a counter circuit having a first and second input connected to a first and second output, respectively, of said first control circuit and a third and fourth input connected to a first and second output, respectively, of said second control circuit,
wherein said first and second control circuits provide signals for use by said counter circuit to generate said plurality of addresses based on said mode select input signal.

22. The memory device according to claim 21, wherein a first mode select signal generates said plurality of addresses in an interleave sequence.

23. The memory device according to claim 22, wherein a second mode select signal generates said plurality of addresses in a binary sequence.

24. The memory device according to claim 21, wherein said one bit of said single address input is the least significant bit of said single address input.

25. The memory device according to claim 24, wherein said another bit of said single address input is the next most significant bit after said least significant bit of said single address input.

26. The memory device according to claim 21, wherein said first control circuit further comprises:
a first logic gate having an input connected to receive said mode select input signal and an output;
a first transistor having a first terminal connected to receive said one bit of said single address input, a second terminal, and a gate terminal connected to receive a first control signal input;
a second logic gate having a first input connected to said output of said first logic gate, a second input connected to said second terminal of said first transistor, and an output connected to said first output of said first control circuit;
a third logic gate having an input connected to said output of said second logic gate, and an output connected to said second output of said first control circuit; and
a second transistor having a first terminal connected to said output of said third logic gate, a second terminal connected to said second terminal of said first transistor, and a gate terminal connected to said gate terminal of said first transistor.

27. The memory device according to claim 26, wherein said first logic gate is an inverter.

28. The memory device according to claim 27, wherein said second logic gate is a NAND gate.

29. The memory device according to claim 28, wherein said third logic gate is an inverter.

30. The memory device according to claim 26, wherein said second transistor is a P-channel transistor.

31. The memory device according to claim 26, wherein said second control circuit further comprises:
a third transistor having a first terminal connected to receive said another bit of said single address input, a second terminal connected to said first output of said second control circuit, and a gate terminal connected to receive said first control signal input;
a fourth logic gate having a first input connected to said output of said first logic gate and an output;
a fifth logic gate having an input connected to said output of said fourth logic gate, and an output connected to said second output of said second control circuit;
a sixth logic gate having an input connected to said output of said fifth logic gate and an output connected to said input of said fifth logic gate; and
a fourth transistor having a first terminal connected to said output of said sixth logic gate, a second terminal connected to a voltage potential, and a gate terminal connected to said output of said fourth logic gate.

32. The memory device according to claim 31, wherein said fourth, fifth and sixth logic gates are inverters.

33. The memory device according to claim 32, wherein said voltage potential is a ground potential.

34. The memory device according to claim 31, further comprising:
a seventh logic gate having a first input connected to receive a clock signal, a second input connected to receive a load signal, and an output; and
an eighth logic gate having an input connected to said output of said seventh logic gate, and an output connected to said gate terminal of said first and third transistors to provide said first control signal input based on said clock signal and said load signal.

35. The memory device according to claim 34, wherein said seventh logic gate is a NAND gate.

36. The memory device according to claim 35, wherein said eighth logic gate is an inverter.

37. The memory device according to claim 21, wherein said counter circuit further comprises:
a first multiplexer having an output, a first control input connected to said first output of said first control circuit, a second control input connected to said second output of said first control circuit, and a first and second signal input; and
a second multiplexer having an output, a first control input connected to said first output of said second control circuit, a second control input connected to said second output of said second control circuit, and a first and second signal input.

38. The memory device according to claim 37, wherein said counter circuit further comprises:
a plurality of flip-flops each having a first and second output, the first output providing a respective count bit to a count output, each flip-flop having a respective toggle input, said first and second output of a first of said plurality of flip-flops being connected, respectively, to said first and second signal input of said first multiplexer, said first and second output of a second of said plurality of flip-flops being connected, respectively, to said first and second signal input of said second multiplexer, and said toggle input of said second of said plurality of flip-flops being connected to said output of said first multiplexer.

39. The memory device according to claim 38, further comprising:
a ninth logic gate having a first input connected to said output of said first multiplexer, a second input connected to said output of said second multiplexer, and an output connectable to a toggle input of a third of said plurality of flip-flops.

40. The memory device according to claim 39, further comprising:
an inverter connected between said output of said logic gate and said toggle input of said third of said plurality of flip-flops.

41. A processing system comprising:
a processing unit; and
a memory device connected to said processing unit, said memory device comprising:
a plurality of memory arrays; and
a circuit for generating a plurality of addresses in said memory arrays from a single address input, said circuit comprising:
a first control circuit having a first input connected to receive a mode select input signal and a second input connected to receive one bit of said single address input;
a second control circuit having a first input connected to receive a complement signal of said mode select input signal and a second input connected to receive another bit of said single address input; and
a counter circuit having a first and second input connected to a first and second output, respectively, of said first control circuit and a third and fourth input connected to a first and second output, respectively, of said second control circuit, wherein said first and second control circuits provide signals for use by said counter circuit to generate said plurality of addresses based on said mode select input signal.

42. The processing system according to claim 41, wherein a first mode select signal generates said plurality of addresses in an interleave sequence.

43. The processing system according to claim 42, wherein a second mode select signal generates said plurality of addresses in a binary sequence.

44. The processing system according to claim 41, wherein said one bit of said single address input is the least significant bit of said single address input.

45. The processing system according to claim 44, wherein said another bit of said single address input is the next most significant bit after said least significant bit of said single address input.

46. The processing system according to claim 41, wherein said first control circuit further comprises:
a first logic gate having an input connected to receive said mode select input signal and an output;
a first transistor having a first terminal connected to receive said one bit of said single address input, a second terminal, and a gate terminal connected to receive a first control signal input;
a second logic gate having a first input connected to said output of said first logic gate, a second input connected to said second terminal of said first transistor, and an output connected to said first output of said first control circuit;
a third logic gate having an input connected to said output of said second logic gate, and an output connected to said second output of said first control circuit; and
a second transistor having a first terminal connected to said output of said third logic gate, a second terminal connected to said second terminal of said first transistor, and a gate terminal connected to said gate terminal of said first transistor.

47. The processing system according to claim 46, wherein said first logic gate is an inverter.

48. The processing system according to claim 47, wherein said second logic gate is a NAND gate.

49. The processing system according to claim 48, wherein said third logic gate is an inverter.

50. The processing system according to claim 46, wherein said second transistor is a P-channel transistor.

51. The processing system according to claim 46, wherein said second control circuit further comprises:
a third transistor having a first terminal connected to receive said another bit of said single address input, a second terminal connected to said first output of said second control circuit, and a gate terminal connected to receive said first control signal input;
a fourth logic gate having a first input connected to said output of said first logic gate and an output;
a fifth logic gate having an input connected to said output of said fourth logic gate, and an output connected to said second output of said second control circuit;
a sixth logic gate having an input connected to said output of said fifth logic gate and an output connected to said input of said fifth logic gate; and
a fourth transistor having a first terminal connected to said output of said sixth logic gate, a second terminal connected to a voltage potential, and a gate terminal connected to said output of said fourth logic gate.

52. The processing system according to claim 51, wherein said fourth, fifth and sixth logic gates are inverters.

53. The processing system according to claim 52, wherein said voltage potential is a ground potential.

54. The processing system according to claim 51, further comprising:
a seventh logic gate having a first input connected to receive a clock signal, a second input connected to receive a load signal, and an output; and
an eighth logic gate having an input connected to said output of said seventh logic gate, and an output connected to said gate terminal of said first and third transistors to provide said first control signal input based on said clock signal and said load signal.

55. The processing system according to claim 54, wherein said seventh logic gate is a NAND gate.

56. The processing system according to claim 55, wherein said eighth logic gate is an inverter.

57. The processing system according to claim 41, wherein said counter circuit further comprises:
a first multiplexer having an output, a first control input connected to said first output of said first control circuit, a second control input connected to said second output of said first control circuit, and a first and second signal input; and
a second multiplexer having an output, a first control input connected to said first output of said second control circuit, a second control input connected to said second output of said second control circuit, and a first and second signal input.

58. The processing system according to claim 57, wherein said counter circuit further comprises:
a plurality of flip-flops each having a first and second output, the first output providing a respective count bit to a count output, each flip-flop having a respective toggle input, said first and second output of a first of said plurality of flip-flops being connected, respectively, to said first and second signal input of said first multiplexer, said first and second output of a second of said plurality of flip-flops being connected, respectively, to said first and second signal input of said second multiplexer, and said toggle input of said second of said plurality of flip-flops being connected to said output of said first multiplexer.

59. The processing system according to claim 58, further comprising:

a ninth logic gate having a first input connected to said output of said first multiplexer, a second input connected to said output of said second multiplexer, and an output connectable to a toggle input of a third of said plurality of flip-flops.

60. The processing system according to claim 59, further comprising:

an inverter connected between said output of said logic gate and said toggle input of said third of said plurality of flip-flops.

61. The processing system according to claim 41, wherein said processing unit and said memory device are on a same chip.

62. A method for selectively generating a binary count sequence or an interleave count sequence from a single address input, comprising the steps of:

receiving a mode select input at a first control circuit and a complement of said mode select signal at a second control circuit;

generating a first and second control signal in said first control circuit based on said mode select input and one bit of said single address input;

generating a first and second control signal in said second control circuit based on said complement of said mode select input and another bit of said single address input;

operating a count circuit based on said first and second control signals generated by said first and second control circuits to generate said binary count sequence or said interleave count sequence.

63. The method according to claim 62, wherein said step of generating a first and second control signal in said first control circuit further comprises:

generating said control signal based on said mode select input and the least significant bit of said single address input.

64. The method according to claim 63, wherein said step of generating a first and second control signal in said second control circuit further comprises:

generating said control signal based on said complement of said mode select input and a next least most significant bit of said single address input.

65. The method according to claim 62, wherein said step of operating further comprises:

multiplexing a first and second output of a first flip-flop based on said first and second control signals from said first control circuit to produce a first multiplexer output;

inputting said first multiplexer output to a toggle input of a second flip-flop;

multiplexing a first and second output of said second flip-flop based on said first and second control signals from said second control circuit to produce a second multiplexer output; and inputting said second multiplexer output to a toggle input of a third flip-flop, wherein said first output of said first and second flip-flop and a first output of said third flip-flop provide said binary count sequence or said interleave count sequence.

* * * * *

UNITED STATES PATENT AND TRADEMARK OFFICE
CERTIFICATE OF CORRECTION

PATENT NO. : 6,363,032 B2  
DATED : March 26, 2002  
INVENTOR(S) : Todd A. Merritt It is certified that error appears in the above-identified patent and that said Letters Patent is hereby corrected as shown below:

Column 2,
Line 22, the word "very" should be changed to -- every --.

Signed and Sealed this

Fourth Day of June, 2002

Attest:

Attesting Officer

JAMES E. ROGAN
Director of the United States Patent and Trademark Office